United States Patent [19]

DeNuccio et al.

[11] Patent Number: 4,694,558

[45] Date of Patent: Sep. 22, 1987

[54] BIMETAL THERMOSTATS AND METHOD OF MANUFACTURE

[75] Inventors: Ron J. DeNuccio, Greensboro, N.C.; Han J. Kim, Concord, Mass.; Chi H. Leung, Greensboro, N.C.

[73] Assignee: GTE Products Corporation, Stamford, Conn.

[21] Appl. No.: 816,496

[22] Filed: Jan. 6, 1986

[51] Int. Cl.[4] ........................ B23P 17/00; C23C 16/40

[52] U.S. Cl. .................................. 29/527.2; 428/619; 428/616; 148/6.2

[58] Field of Search ...................... 29/527.2; 148/6.14, 148/6.2, 131.5; 428/619, 616

[56] References Cited

U.S. PATENT DOCUMENTS

| | | | |
|---|---|---|---|
| 3,759,753 | 9/1973 | Becca et al. | 148/31.5 X |
| 3,839,096 | 10/1974 | Skedgell et al. | 148/6.2 |
| 3,847,685 | 11/1974 | Baboian et al. | 428/619 |
| 4,026,737 | 5/1977 | Takahari et al. | 148/6.14 R |
| 4,370,210 | 1/1983 | Yoshihara et al. | 148/6.2 X |
| 4,414,286 | 11/1983 | Ty | 428/619 X |

FOREIGN PATENT DOCUMENTS

| | | | |
|---|---|---|---|
| 1122172 | 7/1968 | United Kingdom | 148/6.2 |
| 1122173 | 7/1968 | United Kingdom | 148/6.2 |

*Primary Examiner*—Howard N. Goldberg
*Assistant Examiner*—Carl J. Arbes
*Attorney, Agent, or Firm*—James Theodosopoulos

[57] ABSTRACT

Ferrous bimetals bearing easily read indicia and methods of making them. The bimetals of the present invention have a transparent oxide coating of a controlled thickness in the interference range and are prepared by immersing them in a acid bath, then washing away a film that is formed, followed by tempering them in an oxidizing atmosphere. Bimetals prepared this way have a golden hue an are easily marked with indicia that can be read by a consumer.

9 Claims, 1 Drawing Figure

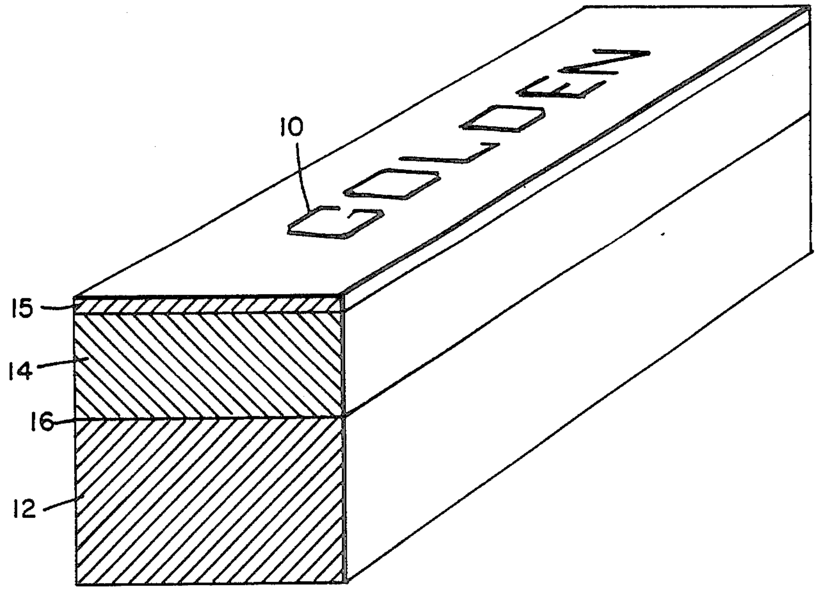
10
GOLDEN
15
14
16
12

BIMETAL THERMOSTATS AND METHOD OF MANUFACTURE

FIELD OF THE INVENTION

This invention relates to bimetal thermostats and to their manufacture. More particularly, the invention relates to bimetal switches in which at least one side is made of a ferrous alloy and upon which an indicia such as letters, numbers, or patterns are marked and are clearly visible.

BACKGROUND OF THE INVENTION

Bimetal thermostats are well known to the prior art and, typically, such thermostats are designed to be deformed at predetermined temperatures. Upon deformation, the bimetal thermostat will move whereby to actuate a mechanical or electrical impulse. Conventional bimetals are used to yield a deflection of the structure with a change in temperature by utilizing the differences in the coefficients of expansion of two alloys that are metallurgically bonded along a common interface. As can be appreciated, these bimetal materials deflect throughout a given temperature range and hence it is necessary to label them so that the consumer can know their characteristics.

In the manufacture of ferrous metal bimetals according to the prior art, it has been conventional to temper the bimetal piece and relieve residual stress by heating it in an oxidizing atmosphere after the two sections of the bimetal have been fabricated and shaped into a final usable form. One of the more successful tempering operations has been to heat the bimetal in a salt bath at 600 degrees F. for 60 to 90 minutes. During this heat treatment, a dark purple to dark blue-hued ferrous oxide coating develops on the surface of the bimetal. This coloration varies according to the thickness of the oxide coating that is formed. The indicia which were marked previously are difficult to read and the product is less appealing, cosmetically.

SUMMARY OF THE INVENTION

We have found that a golden-hued oxide coating or controlled thickness coating in an interference color range can be formed on at least one side of a ferrous-based alloy bimetal if certain process steps are followed in the manufacture of the device. As mentioned above, the bimetals are manufactured by bonding together two metal strips having different coefficients of expansion. One of the more successful techniques for bonding the metals together involves cold bonding, whereby two or more individual coils of metal are continuously metallurugically bonded together with pressure. The bonding of the two metals occurs at the interface and forms a laminated construction. After the bonding, the bimetals are degreased, sintered, roll processed to final dimensions and imprinted with an indicia. The bimetals will then be subsequently treated to temper them to relieve forming stress. As mentioned above, the tempering process which is commonly used involves immersion of the bimetal in a salt bath at a temperature between about 500 and 750 degrees F. During the tempering, the surface of the metal is oxidized due to oxygen which is present in the salt bath and while it is cooling in air. This oxidation, when developed, has a deep blue to violet hue and indicia that is marked thereon cannot be easily read. If, prior to heat treating but after degreasing, the bimetals are acid etched as described herein, the transparent interference oxide coating will form through which the indicia can easily be seen.

DESCRIPTION OF THE DRAWING

The FIGURE is a perspective, cross sectional view of a length of thermostat bimetal prepared in accordance with the present invention.

DESCRIPTION OF THE PREFERRED EMBODIMENTS

Referring to the drawing, the bimetal thermostat provided by this invention is shown to include a first section of metal 12 having a relatively high coefficient of thermal expansion, a second section of metal 14 having a relatively low coefficient of thermal expansion and an oxide coating 15 disposed upon at least upon one side thereof. An indicia 10 is marked upon the metal 14, prior to the oxidation treatment, but after the acid treatment described in the invention. As is described previously, the metal sections 12 and 14 are metallurgically bonded together at an interface 16 in any conventional way to form the bimetal. Usually, the sections of the bimetal are overlaid and then rolled under great pressure as is required to form the thermostat bimetal. The metal sections 12 and 14 comprise those materials that are conventionally employed as high and low expansion materials in thermostat metals. The materials of the sections 12 and 14 are selected with respect to their thermal expansion properties, moduli of elasticity, electrical resistivity, and the like and are proportioned with respect to thickness relativwe to each other such that the desired flexivity is produced. At least one of the sections 12 and 14 is a ferrous metal or ferrous alloy and this is the side upon which the indicia is conventionally marked.

According to the present invention, we have found that immediately after the bimetals are made by metallurgically bonding the two strips together, they should be cleaned and degreased to remove processing films and residues. After the bimetals have been cleaned, we have found that they should be immersed in an acid solution (generally having pH between about 0.05 and 0.5). The acid solution is preferably prepared by mixing between about 3 and 10 Vol.% concentrated nitric acid and between about 3 and 20 Vol.% glacial acetic acid. The balance of the solution is water. After mixing the nitric and acetic acids and the water the solution is heated to approximately 50 degrees C. for use in the process of the present invention. The bimetals are immersed in the warm acid solution for approximately ten seconds at which point a loose grey film forms on their outer surfaces. Immediately after immersion, the bimetals are taken from the bath and the loose grey film is removed by thoroughly scrubbing them with mild soapy water and drying. The solution concentrations, temperature of the bath and time of immersion described above provide the best results, although these parameters can be adjusted independently to get a desired degree of surface etching.

Subsequent to the acid treatment, and the indicia imprinting operation, the bimetals are heated at an elevated temperature in an air atmosphere for tempering, generally between about 500 and 750 degrees F., preferably about 600 degrees F. for 60 minutes. Alternatively, the bimetals can be heated in a salt bath at the same temperature for the same length of time. In either case, the oxide coatings on the exterior of the bimetals have a golden hue which is transparent enough to show indicia underneath the film. Measurement of the oxide coating indicates that it is quite thin, generally in the neighborhood of between about 440 and 480 Angstroms, and usually about 460 Angstroms based on the interference color chart (Ref. Oxidation of Metals and Alloys; Kubaschewski and Evans; Butterworths; London; 1962; pages 182–189). This golden-hued coating is to be distinguished from the blue coloration of the thicker oxide coating, which is generally between about 600 and 800 Angstroms.

The following example is given to enable those skilled in the art to more clearly understand and practice the present invention. The example should not be considered as limitative upon the scope of the invention, but as merely being illustrative and representative thereof.

SPECIFIC EXAMPLE

Bimetals formed of 1″×6″×0.012″ sections of cleaned and degreased thermostatic alloys having a high expansion side composition of 75% Fe, 22% Ni, 3% Cr, and a low expansion side composition of 64% Fe and 36% Ni were immersed in a warm acid solution formed by mixing 5 Vol.% concentrated nitric acid with 10 Vol.% glacial acetic acid and the remaining 85% water. The acid solution was heated to approximately 50 degrees C. and the bimetals were immersed in it for approximately ten seconds. A loose grey film formed on the outside of the bimetals. The bimetals were removed from the acid bath, immediately scrubbed with a damp cloth and mild soapy water and dried. Subsequently, indicia was imprinted on the low expansion side. To evaluate the process, subsequent to the washing and drying, one of the bimetals was heated at 600 degrees F. for sixty minutes in a box furnace with an air atmosphere. Another treated and indicia printed bimetal was heated at 600 degrees for sixty minutes in a salt bath, also to evaluate the effect of the process. In both cases, the bimetals had a golden hue easily displaying and appropriate indicia underneath the transparent golden oxide film and the legends were clearly visible and could be easily read.

It is apparent that modifications, improvements, and changes can be made upon the processes and devices of the present invention but it is our intention only to be limited by the scope of the appended claims.

As our invention we claim:

1. In a process for manufacturing golden-hued indicia bearing thermostatic bimetals having two sections of metal joined to each other and adapted to move in response to changes in temperature, said bimetals having a section of low thermal expansion and another of high thermal expansion, at least one of said sections having a predominantly ferrous composition and having an oxide film disposed thereon, the steps which comprise:

forming a bimetal with at least one section having a predominantly ferrous composition; and immersing said bimetal in an acid bath; and forming a grey ferrous oxide film on the external surface of the section having the predominantly ferrous composition; and washing said bimetal whereby said grey film is removed, and marking an indicia on said washed bimetal; and heating said bimetal in an oxidizing atmosphere to temper it and to form a transparent ferrous oxide film on at least said section having a predominantly ferrous composition, said ferrous oxide film having a controlled thickness in the interferance color range and said indicia being visible thereon.

2. The process according to claim 1 wherein the film is a golden-hued ferrous oxide film and has a thickness of between about 440 and 480 Angstroms.

3. The process according to claim 1 wherein said heating is conducted at a temperature between about 500 and 750 degrees F. for a sufficient time to impart said golden hue to said section.

4. The process according to claim 3 wherein said bimetal is heated in a box furnace in an air atmosphere or in a salt bath.

5. The process according to claim 4 wherein said acid bath has a pH between about 0.05 and 0.5.

6. The process according to claim 5 wherein said acid bath is aqueous solution containing between about 3 and 10 percent by volume nitric acid and between about 3 and 20 percent volume acetic acid.

7. A bimetal having at least one section formed of a ferrous metal, said bimetal having a thin ferrous oxide film on the surface of the section formed of the ferrous metal, said thin ferrous oxide coating having a thickness between about 440 and 480 Angstroms such that it has a golden hue, said bimetal further having indicia marked on said section having a thin ferrous oxide film.

8. The bimetal according to claim 7 wherein said golden-hued oxide coating has a thickness of between about 440 and 480 Angstroms.

9. The bimetal according to claim 7 wherein the ferrous metal section has a low thermal rate of expansion.

* * * * *